(12) United States Patent
Heller et al.

(10) Patent No.: US 10,114,743 B2
(45) Date of Patent: Oct. 30, 2018

(54) MEMORY ERASE MANAGEMENT

(71) Applicant: Western Digital Technologies, Inc., San Jose, CA (US)

(72) Inventors: Tal Heller, Aloney Abba (IL); Asaf Garfunkel, Tel Aviv (IL); Hadas Oshinsky, Kfar Saba (IL); Yacov Duzly, Ra'anana (IL); Amir Shaharabany, Kochav Yair (IL); Judah Gamliel Hahn, Ofra (IL)

(73) Assignee: SANDISK TECHNOLOGIES INC., San Jose, CA (US)

( * ) Notice: Subject to any disclaimer, the term of this patent is extended or adjusted under 35 U.S.C. 154(b) by 184 days.

(21) Appl. No.: 15/092,236

(22) Filed: Apr. 6, 2016

(65) Prior Publication Data

US 2017/0293553 A1 Oct. 12, 2017

(51) Int. Cl.
| | |
|---|---|
| *G06F 12/02* | (2006.01) |
| *G06F 3/06* | (2006.01) |
| *G06F 11/10* | (2006.01) |
| *G11C 29/52* | (2006.01) |
| *H03M 13/11* | (2006.01) |
| *H03M 13/15* | (2006.01) |

(52) U.S. Cl.
CPC ........ *G06F 12/0246* (2013.01); *G06F 3/0611* (2013.01); *G06F 3/0652* (2013.01); *G06F 3/0659* (2013.01); *G06F 3/0665* (2013.01); *G06F 3/0679* (2013.01); *G06F 11/1068* (2013.01); *G11C 29/52* (2013.01); *G06F 2212/1024* (2013.01); *G06F 2212/152* (2013.01); *G06F 2212/214* (2013.01); *G06F 2212/403* (2013.01); *G06F 2212/7205* (2013.01); *H03M 13/1102* (2013.01); *H03M 13/152* (2013.01); *H03M 13/1515* (2013.01)

(58) Field of Classification Search
CPC .................................................. G06F 12/0246
USPC ........................................................ 711/103
See application file for complete search history.

(56) References Cited

U.S. PATENT DOCUMENTS

| | | | |
|---|---|---|---|
| 2003/0041210 A1 | 2/2003 | Keays | |
| 2004/0188710 A1* | 9/2004 | Koren | G11C 16/102 257/197 |
| 2006/0044934 A1* | 3/2006 | Wong | G06F 12/0246 365/239 |
| 2007/0113030 A1 | 5/2007 | Bennett et al. | |
| 2009/0287861 A1* | 11/2009 | Lipps | G06F 13/28 710/28 |
| 2011/0113186 A1 | 5/2011 | Bruce et al. | |

(Continued)

FOREIGN PATENT DOCUMENTS

WO WO2006132939 A2 12/2006

*Primary Examiner* — Gautam Sain
(74) *Attorney, Agent, or Firm* — Patterson & Sheridan, LLP; Steven Versteeg

(57) ABSTRACT

A device includes a memory and a controller coupled to the memory. The controller is configured to maintain a first address translation table associated with the memory and a second address translation table associated with the memory. The controller is further configured to receive a command to erase the memory. The controller is further configured to switch an indicator of an active address translation table from the first address translation table to the second address translation table in response to receiving the command.

33 Claims, 12 Drawing Sheets

(56) References Cited

U.S. PATENT DOCUMENTS

| | | | |
|---|---|---|---|
| 2011/0320758 A1* | 12/2011 | Craddock | G06F 12/0292 711/206 |
| 2012/0011340 A1* | 1/2012 | Flynn | G06F 12/0246 711/171 |
| 2014/0013028 A1* | 1/2014 | Rametta | G11C 16/3495 711/103 |
| 2014/0337560 A1* | 11/2014 | Chun | G06F 12/0246 711/103 |
| 2014/0365711 A1* | 12/2014 | Makida | G06F 12/0246 711/103 |
| 2015/0058597 A1* | 2/2015 | King | G06F 12/1081 711/206 |
| 2016/0162316 A1* | 6/2016 | King | G06F 9/45558 718/1 |

* cited by examiner

MEMORY ERASE MANAGEMENT

FIELD OF THE DISCLOSURE

The present disclosure is related to erasing memory.

BACKGROUND

Non-volatile data storage devices, such as embedded flash memory, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more.

Embedded storage devices that are assembled in a mobile device, such as a mobile phone, are often programmed to store content ("preloaded content") before being soldered to a printed circuit board (PCB). The preloaded content may include an operating system (OS) image, one or more boot partitions, or other content such as music, maps, etc. The process of programming the preloaded content into the storage device includes erasing the storage device, writing the preloaded content into the storage device, and verifying the preloaded content has been stored accurately. A manufacturing cost of the mobile device may be reduced by reducing the time required to erase, preload content, and verify the preloaded content.

Modern flash management (FM) architectures typically manage large tables of logical address to physical address mappings. In addition, some FM architectures also manage tables of physical address to logical address mappings. Erasing a flash storage device to write preloaded content may be performed by modifying the FM mapping tables to reflect an erase condition. However, as storage capacity increases, the size of the FM mapping tables also increases, resulting in more FM table entries to be modified to reflect the erase condition. As a result, a latency of the erase operation and a manufacturing cost associated with preloading content increase with increased storage capacity.

DETAILED DESCRIPTION

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes systems, devices, and methods of modifying an indicator of an address translation table associated with a memory in response to receiving a command to erase the memory. The indicator may be "switched" (e.g., modified) from identifying a first address translation table as an active address translation table to identifying a second address translation table as the active address translation table. In a particular implementation, the indicator may include or correspond to a pointer, and a value of the pointer may be modified from indicating an address of the first address translation table to indicating an address of the second address translation table. In another particular implementation, the indicator may include or correspond to a handler that indicates the active address translation table, and the handler may be switched from indicating an address of the first address translation table to indicating an address of the second address translation table. Because a single value (e.g., the indicator) is modified, systems, devices, and methods of the present disclosure may perform an erase of an entirety of a memory faster than by using other memory erase techniques.

Figure 1:
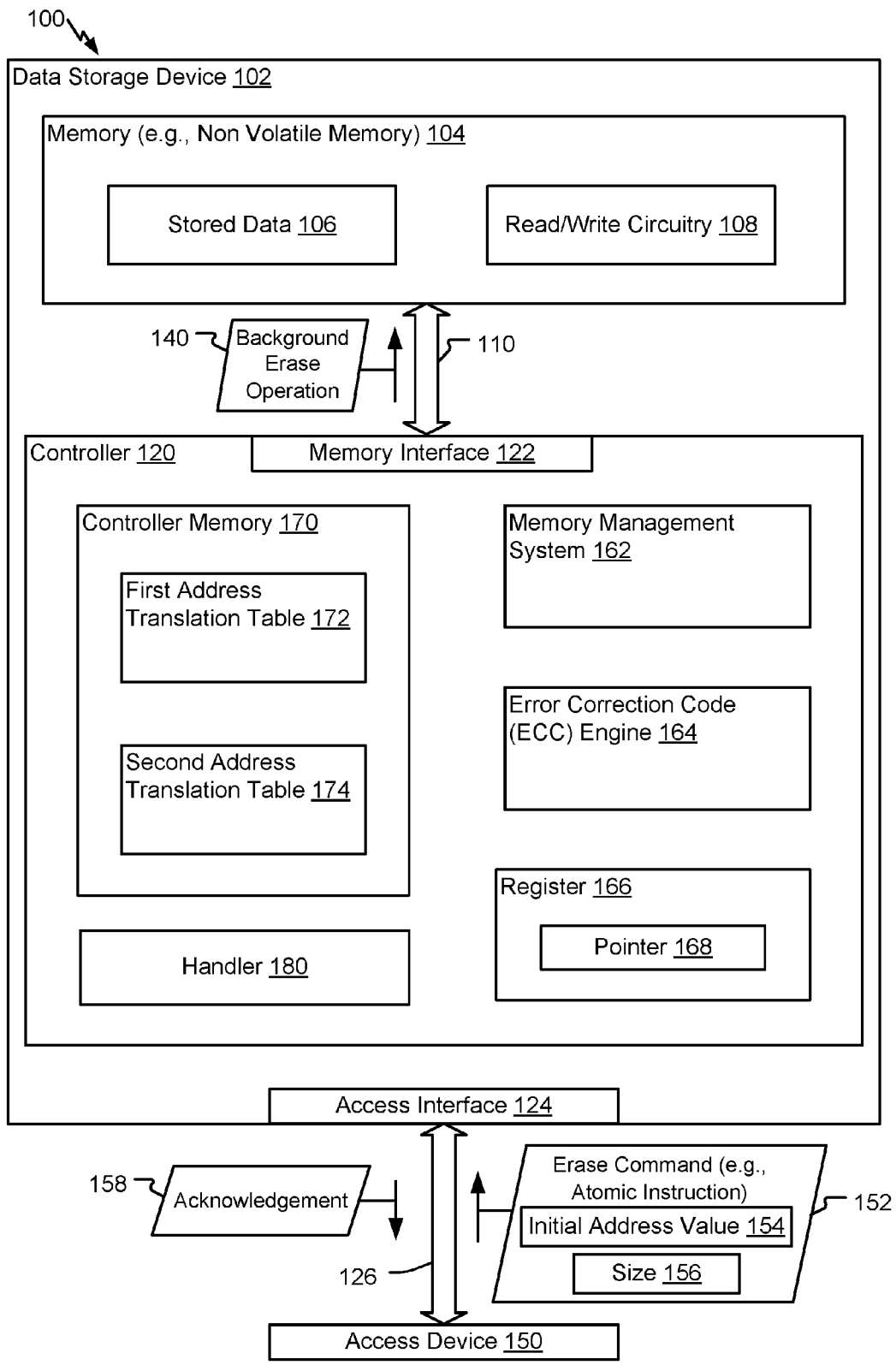
FIG. 1 is a block diagram of an illustrative example of a system including a device configured to modify an indicator for an address translation table.

FIG. 1 illustrates a system 100 that includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150.

The data storage device 102 includes a memory 104 and a controller 120. In a particular implementation, the memory 104 may be a non-volatile memory. For example, the memory 104 may be a flash memory (e.g., a NAND flash memory, a NOR flash memory, etc.). The memory 104 may store data in multiple regions that include one or more groups of storage elements. In a particular example, the groups of storage elements may include word lines, blocks, pages, zones, planes, dies, or other regions of the memory 104. The one or more storage elements may be configured to store data, such as stored data 106. The one or more storage elements may store multi-level cell (MLC) data or single-level cell (SLC) data. SLC data may be stored as a single bit per storage element, and MLC data may be stored as multiple bits per storage element. The memory 104 may include read/write circuitry 108 that is configured to perform operations to read the stored data 106 or to write additional data to the memory 104. For example, the read/write circuitry 108 may include one or more buffers, drivers, or other circuitry used to perform read operations, write operations, or both, at the memory 104.

The controller 120 is coupled to the memory 104 via a bus 110, an interface (e.g., interface circuitry, such as a memory interface 122), another structure, or a combination thereof. The controller 120 and the memory 104 may exchange information via the bus 110, the memory interface 122, or a combination thereof. For example, one or more of write data, read data, and other data or instructions may be exchanged between the controller 120 and the memory 104 via the bus 110, the memory interface 122, or a combination thereof. In some implementations, the memory 104 may include an interface configured to enable communications between the controller 120 and the memory 104 via the bus 110.

The controller 120 includes a controller memory 170, a memory management system 162, an error correction code (ECC) engine 164, and one or more registers, such as an illustrative register 166. The controller memory 170 may be a memory device, such as a random access memory (RAM) or other volatile memory, that is configured to store instructions or data used by the controller 120 during performance of one or more operations. In some implementations, data illustrated as being stored at other components (e.g., the memory management system 162, the ECC engine 164, the register 166, or a combination thereof) may be stored at the controller memory 170 and may be accessible to the other components.

The memory management system 162 is configured to generate and maintain control data and other information to manage operations at the memory 104. To illustrate, the memory management system 162 may be configured to maintain tables, such as address translation tables, used to perform read operations and write operations at the memory 104. For example, the memory management system 162 may be configured to maintain a first address translation table 172 associated with the memory 104 and a second address translation table 174 associated with the memory 104. In a particular implementation, the address translation tables 172, 174 are maintained or stored at the controller memory 170. Alternatively, the address translation tables 172, 174 may be maintained or stored at the memory 104.

In a particular implementation, the address translation tables 172, 174 are configured to store logical-to-physical address mappings, and may be referred to as "L2P" tables. Additionally or alternatively, the address translation tables 172, 174 may include reverse mapping tables (e.g., physical-to-logical address translation tables). In a particular implementation, the address translation tables 172, 174 may be stored in a boot block of code executed by the controller 120. In another particular implementation, the address translation tables 172, 174 may be included in (or part of) a master storage table (MST).

The address translation tables 172, 174 may be hierarchical. For example, the first address translation table 172 may include a first grouping of entries, and at least one entry of the first group of entries may indicate a second grouping of entries. The second grouping of entries may indicate one or more physical addresses of the memory 104, and each entry may be associated with a corresponding logical address used by the controller 120. The second address translation table 174 may also be a hierarchical address translation table. In other implementations, the address translation tables 172, 174 may each have a single level, and each entry may indicate a physical address at the memory 104 that is associated with a corresponding logical address used by the controller 120. Address translation tables are illustrated with reference to FIGS. 2A-2C, 3A-3B, and 4A-4C.

The first address translation table 172 may be generated during initial programming of the data storage device 102. In a particular implementation, the second address translation table 174 may be generated during operation of the data storage device 102 (e.g., of the memory 104). In an alternate implementation, the second address translation table 174 may be generated during initial programming of the data storage device 102. Generation of the address translation tables 172, 174 may include setting values for entries in the address translation tables 172, 174 to an initial state, such as an erase state. For example, after initialization, each entry in the first address translation table 172 may be set to an initial state (e.g., an erase state). The address translation tables 172, 174 may be updated (e.g., "built") dynamically. For example, as the controller 120 determines logical-to-physical address translations, entries in the address translation tables 172, 174 may be modified from the initial state to indicate the determined translations. Updating of address translation tables is further described and illustrated with reference to FIGS. 3A-3B.

The memory management system 162 may be further configured to maintain an indicator of an active address translation table. The indicator may identify or indicate a particular address translation table as an active address translation table. To illustrate, the memory management system 162 may maintain multiple address translation tables at a time. Of the multiple address translation tables, one address translation table may be designated as the active address translation table. The address translation table that is designated as the active address translation table may be used to perform logical-to-physical address translations to enable operations, such as read operations and write operations, at the memory 104. Address translation tables that are not designated as the active address translation table may be maintained in an initial state, or may be erased during background operations.

In a particular implementation, the indicator includes or corresponds to a pointer 168. For example, a value of the pointer 168 may indicate a location of the active address translation table. As a particular example, after initial programming of the data storage device 102, the pointer 168 may indicate a location of the first address translation table 172. The memory management system 162 may be configured to switch the indicator of the active address translation table from the first address translation table 172 to the second address translation table 174 in response to receiving a command to erase the memory 104. For example, the memory management system 162 may be configured to modify a value of the pointer 168 from a first value indicating an address (e.g., a location) of the first address translation table 172 to a second value indicating an address of the second address translation table 174, as further described herein. In a particular implementation illustrated in FIG. 1, the register 166 includes (e.g., stores) the pointer 168. Alternatively, the pointer 168 may be stored at the controller memory 170.

In another particular implementation, the indicator includes or corresponds to a handler 180. The handler 180 may refer to a structure that is pointing indirectly to a specific structure or address in a memory, such as the controller memory 170. Additionally or alternatively, the handler 180 may refer to a callback routine or other code, such as an event handler, that operates asynchronously and transparently to a component (e.g., a hardware or software component) that invokes the handler 180. The handler 180 may enable an address to be changed transparent to a module (or other hardware or software component). Access to the structure or address may be accomplished successfully after the change without notification to the module (or other hardware or software component). For example, the controller 120 may be configured to access a particular location to determine an address of the active address translation table, and the handler 180 may be configured to modify a value at the particular location notifying the controller 120 (other than the memory management system 162). The memory management system 162 may be configured modify the handler 180, or to cause the handler 180 to modify a maintained value or indicator, to switch the active address translation table from the first address translation table 172 to the second address translation table 174 in response to receiving a command to erase the memory 104. For example, the memory management system 162 may cause the handler 180 to switch from indicating an address of the first address translation table 172 to indicating an address of the second address translation table 174.

The memory management system 162 may be further configured to provide acknowledgement(s) in response to completing commands. For example, the memory management system 162 may be configured to perform one or more operations (e.g., modifying the indicator) in response to receiving a command to erase the memory 104, and in response to completing the one or more operations, the memory management system 162 may cause an acknowledgement to be provided (e.g., transmitted) to the access device 150. For example, in response to modifying the indicator to indicate an address of the second address translation table 174, the memory management system 162 may cause an acknowledgement to be transmitted to the access device 150. The acknowledgement may be transmitted before entries in the first address translation table 172 are erased, as further described herein.

The ECC engine 164 is configured to perform ECC processing on input data, such as user data received by the controller 120 from the access device 150, to generate one or more ECC code words. For example, the ECC engine 164 may process the input data using an ECC encoding technique, such as a Reed-Solomon encoding technique, a Bose-Chaudhuri-Hocquenghem (BCH) encoding technique, a low-density parity check (LDPC) encoding technique, a turbo encoding technique, one or more other ECC encoding techniques, or a combination thereof, as illustrative, non-limiting examples. The one or more ECC code words may be sent (e.g., transmitted) from the controller 120 to the memory 104 and stored as the stored data 106.

The ECC engine 164 may also be configured to receive data, such as one or more ECC code words, from the memory 104 and to process the received data based on one or more ECC decoding techniques to generate decoded data (e.g., output data). The decoded data may be provided to the access device 150, for example in response to a read command from the access device 150. In some implementations, the ECC engine 164 may include an encoder configured to generate ECC code words based on input data and a decoder configured to generate output data based on received ECC code words. In other implementations, the ECC engine 164 includes a single component configured to perform the operations of the encoder and the decoder.

The ECC engine 164 may be configured to operate in accordance with the memory management system 162. For example, after the memory management system 162 modifies the indicator to identify an address of the second address translation table 174, one or more ECC code words generated by the ECC engine 164 may be stored at a physical address included in an entry in the second address translation table 174.

The access device 150 may include a memory interface (not shown) and may be configured to communicate with the data storage device 102 via the memory interface to read data from and write data to a memory 104 of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory 104 in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the data storage device 102. For example, the access device 150 may be configured to provide data to be stored at the data storage device 102 or to request data to be read from the data storage device 102. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

During operation, the memory management system 162 may maintain the first address translation table 172 and the second address translation table 174. In a particular implementation, the first address translation table 172 may be generated during an initial programming stage of the data storage device 102, and the second address translation table 174 may be generated during operation of the data storage device 102 (e.g., operation of the memory 104). Alternatively, the first address translation table 172 and the second address translation table 174 may both be generated during an initial programming stage of the data storage device 102.

The controller 120 may receive an erase command 152 from the access device 150 via the communication path 126 (e.g., a bus). In another particular implementation, the controller 120 may receive the erase command 152 from a host device via a bus. The erase command 152 may be an instruction to erase an entirety of the memory 104. In a particular implementation, the erase command 152 may be an atomic instruction. For example, the erase command 152 may be completed in a single step relative to other threads operating with respect to the memory 104 (e.g., the atomic instruction is either completed or fails within a single step with reference to other threads). Additionally or alternatively, the erase command 152 includes an initial address value 154 and a size 156. The initial address value 154 indicates a first address (of one or more addresses) that is to be erased by the erase command 152. The size 156 indicates an amount of storage space in the memory 104 that is to be erased. In a particular implementation, because the erase command 152 indicates to erase an entirety of the memory 104, the initial address value 154 indicates a designated initial address of the memory 104, such as an address indicated by all zeroes, and the size 156 indicates total size of the memory 104 (as compared to a fraction or percentage of the total size).

In response to receiving the erase command 152, the memory management system 162 may switch an indicator of an active address translation table from the first address translation table 172 to the second address translation table 174. To illustrate, prior to receiving the erase command 152, the first address translation table 172 may be selected as the active address translation table, and the indicator may identify or indicate an address of the first address translation table 172. In a particular implementation, in response to receiving the erase command 152, the memory management system 162 may modify the indicator to cause the indicator to identify or indicate an address of the second address translation table 174.

In a particular implementation, the indicator includes or corresponds to the pointer 168, and, prior to modification, a value of the pointer 168 indicates an address of the first address translation table 172. The memory management system 162 may modify the value of the pointer 168 to cause the value of the pointer 168 to indicate an address of the second address translation table 174. For example, the memory management system 162 may modify or overwrite a value stored at the register 166 (e.g., the value of the pointer 168) with an updated value that indicates the address of the second address translation table 174. In another particular implementation, the pointer 168 may be stored in the controller memory 170, and the memory management system 162 may modify or overwrite the value at the controller memory 170 with an updated value that indicates the address of the second address translation table 174.

Modifying the value of the pointer 168 may "switch" the indicator from indicating the first address translation table 172 as the active address translation table to indicating the second address translation table 174 as the active address translation table. The second address translation table 174 may be initialized (e.g., may not contain any entries or may contain entries that are set to an initial state, such as an erase state). Thus, switching the active address translation table from the first address translation table 172 to the second address translation table 174 may effectively perform a "full erase" of the memory 104. To illustrate, because the second address translation table is initialized (e.g., does not contain any values), the memory 104 may appear erased to the controller 120. Switching the active address translation table from the first address translation table 172 to the second address translation table 174 by modifying the pointer 168 is further described and illustrated with reference to FIGS. 4A-4C.

In another particular implementation, the memory management system 162 may set a value of the pointer 168 to a particular value in response to receiving the erase command 152. To illustrate, the memory management system 162 may set the value of the pointer 168 to a NULL value in response to receiving the erase command 152. For example, the memory management system 162 may write an all-zero value to the register 166. In other implementations, the particular value may be an initial value, an erase state value, or another value. Setting the value of the pointer 168 to a NULL value may effectively perform a full erase of the memory 104. Setting a pointer value to a particular value in response to receiving the erase command 152 is further described and illustrated with reference to FIGS. 2A-2C.

In another particular implementation, the indicator includes or corresponds to the handler 180, and the handler 180 identifies or indicates the active address translation table. For example, prior to modification, the handler 180 may indicate an address of the first address translation table 172. In this implementation, the memory management system 162 may cause the handler 180 to be modified such that the handler 180 indicates an address of the second address translation table 174 in response to receiving the erase command 152. For example, memory management system 162 may cause the handler 180 to modify (or overwrite) a value indicating an address of the first address translation table 172 with a value indicating an address of the second address translation table 174.

Because the indicator is modified to reflect a clean or initialized address translation table (e.g., the second address translation table 174) or is set to a particular value (e.g., a NULL value), the memory 104 may appear fully erased to the controller 120. For example, the controller 120 may access a memory location that is designated to store the active address translation table and, in response to receiving a particular value (e.g., an erase state value, a NULL value, an initialized value, etc.), the controller 120 may interpret the memory 104 as being erased, even if entries in the first address translation table 172 have not yet been set to an erase state.

After modifying the indicator (e.g., the pointer 168 or the handler 180), the memory management system 162 may generate an acknowledgement 158. As illustrated in FIG. 1, the memory management system 162 may cause the controller 120 to transmit (e.g., send) the acknowledgement 158 to the access device 150 via the communication path 126. In another implementation, the memory management system 162 may cause the controller 120 to transmit (e.g., send) the acknowledgement 158 to a host device. The acknowledgement 158 may indicate completion of the erase command 152. A duration of a time period from receipt of the erase command 152 by the controller 120 to transmission of the acknowledgement 158 to the access device 150 may be less than a threshold. In a particular implementation, the threshold is approximately 1 millisecond (ms). Thus, the data storage device 102 may be able to complete a full erase command for the memory 104 in approximately 1 ms or less.

Subsequent to modifying the indicator (e.g., the pointer 168 or the handler 180) and sending the acknowledgement 158 to the access device 150, one or more entries in the first address translation table 172 may be set to an erase state during a background erase operation 140 at the memory 104. For example, during periods of inactivity at the memory 104, the controller 120 may perform the background erase operation 140 to set the one or more entries of the first address translation table 172 to the erase state. In this manner, the erase command 152 may be performed quickly (e.g., by modifying a value of the indicator and sending the acknowledgement 158), and setting the entries of the first address translation table 172 to the erase state may be delayed until a time period of inactivity (e.g., a time when resources are available) at the memory 104.

The data storage device 102 of FIG. 1 may perform erase operations by switching (e.g., modifying) a value of an indicator. Thus, a delay of erase operations may be reduced as compared to a delay associated with modifying each entry in an active address translation table. To illustrate, a delay of performing an erase command may be reduced to a delay associated with modifying the indicator (e.g., the pointer 168 or the handler 180) and generating an acknowledgement. Thus, a delay associated with performing memory erase operations may be reduced (e.g., to approximately 1 ms), thereby improving performance and throughput of the data storage device 102.

Figure 2A:
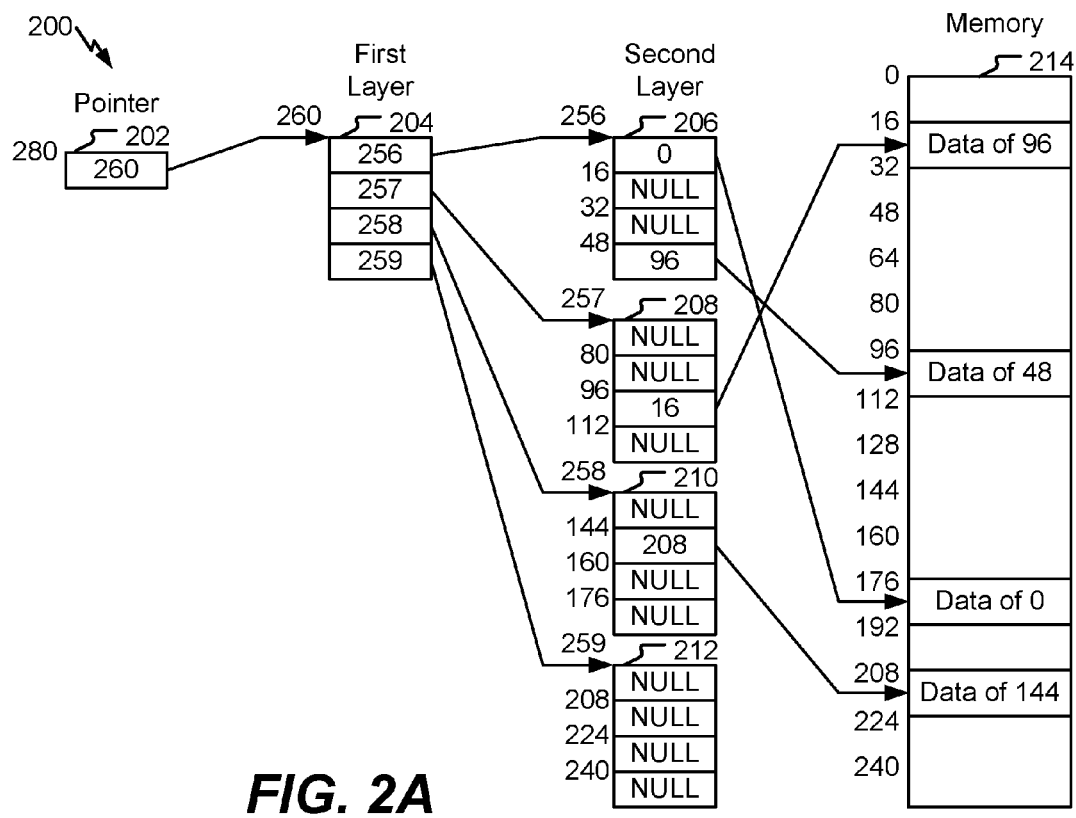
FIGS. 2A-2C illustrate an illustrative example of a method of setting a value of an indicator of an active address translation table to a particular value.
Figure 2B:
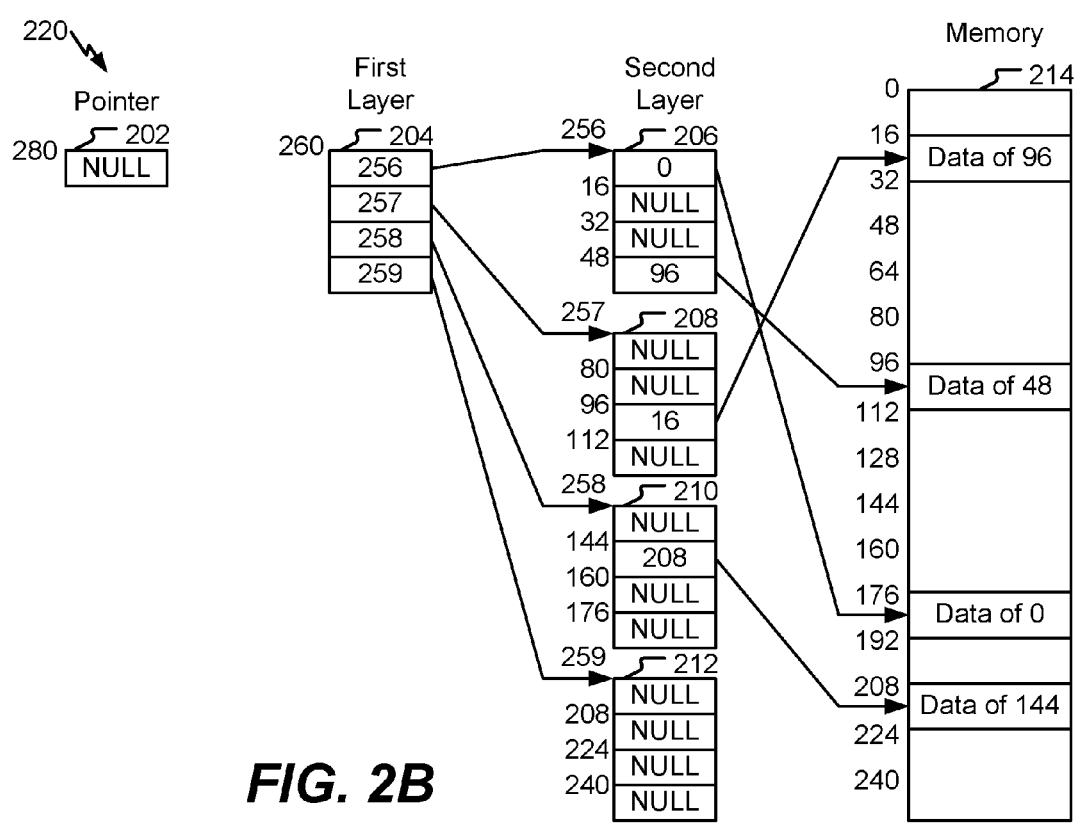
Figure 2C:
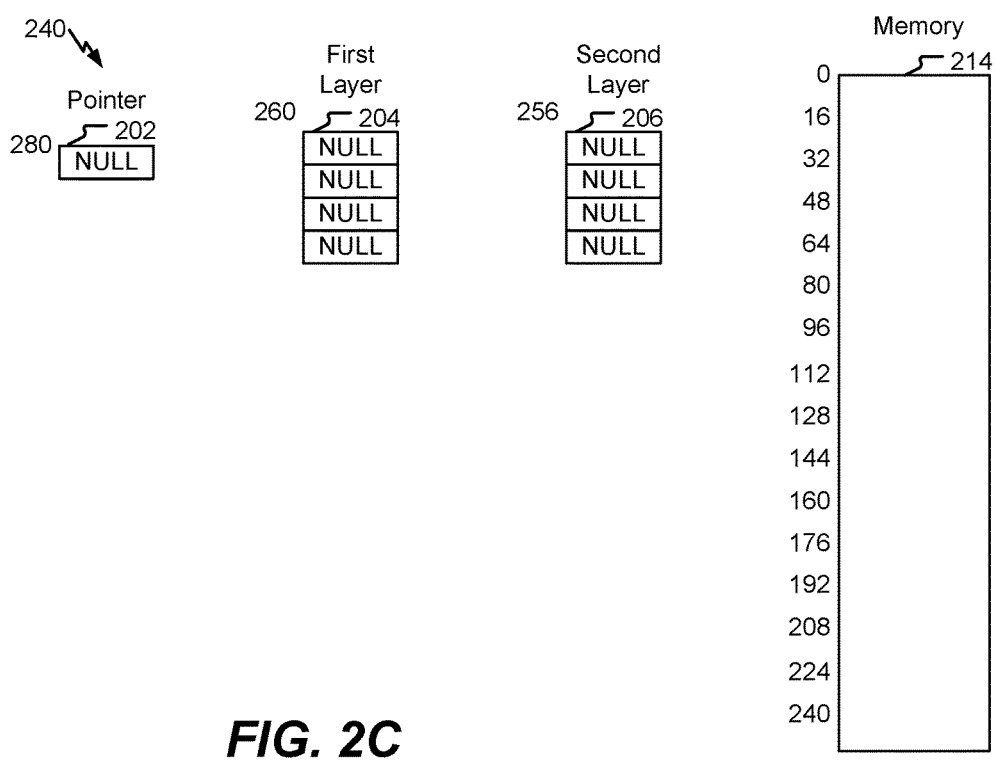

FIGS. 2A-2C illustrate an illustrative example of a method of setting a value of an indicator of an active address translation table to a particular value. Referring to FIG. 2A, a first portion of the method is shown and designated 200. In FIG. 2A, a pointer 202 points to an active address translation table. In a particular implementation, the pointer 202 may correspond to the pointer 168 of FIG. 1. The pointer 202 indicates an address of a first layer 204 of an address translation table. The pointer 202 may also be referred to as the "root" of the address translation table. The first layer 204 includes one or more entries. One or more entries in the first layer 204 may indicate addresses of portions of a second layer of the address translation table. For example, the address may be an address in the controller memory 170 of FIG. 1. In FIG. 2A, the second layer includes a first portion 206, a second portion 208, a third portion 210, and a fourth portion 212. The second layer includes one or more entries that may indicate a logical-to-physical mapping associated with a corresponding physical address in a memory 214. In a particular implementation, the memory 214 may correspond to the memory 104 of FIG. 1.

FIG. 2A illustrates an implementation of an address translation table having 16 entries in the second layer (e.g., portions 206-212 each having four entries), and entries having a non-NULL value may correspond to a 16 kilobyte (KB) block in the memory 214. In other implementations, the second layer of the address translation table may have fewer than 16 or more than 16 entries, and the corresponding blocks in the memory 214 may be larger than 16 KB or smaller than 16 KB. The 16 entries are divided among the portions 206-212 of the second layer of the address translation table, and each of the portions 206-212 are indicated by one of four entries in the first layer 204 of the address translation table. In other implementations, the layers may be divided differently and may have other numbers of entries. The implementation in FIG. 2A illustrates four entries (e.g., blocks of data) being stored in the memory 214, at memory locations (e.g., physical addresses, in KB) 16, 96, 176, and 208. Logical-to-physical mappings are stored in entries of the second layer of the address translation table at table locations (e.g., table byte indices) 0, 48, 96, and 144, respectively.

Referring to FIG. 2B, a second portion of the method of setting a value of an indicator of an active address translation table to a particular value is shown and designated 220. The second method portion illustrated in FIG. 2B may be subsequent to the first method portion of FIG. 2A.

In FIG. 2B, a value of the pointer 202 is set to NULL. In other implementations, the value of the pointer 202 may be set to an erase state value, an initialized value, or a different particular value other than NULL. Setting the value of the pointer 202 to NULL (or another particular value) may cause a controller, such as the controller 120 of FIG. 1, to interpret the memory 214 as being empty or fully erased. For example, in response to an attempt to access the address translation table indicated by the pointer 202, the NULL value may be returned. Return of the NULL value may indicate that the memory 214 is empty or fully erased. Thus, a full erase of the memory 214 may be achieved via performance of a single operation (e.g., changing the value of the pointer 202). As described with reference to FIG. 1, after changing the value of the pointer 202, an acknowledgement may be sent to an access device to indicate completion of an erase command. In this manner, a command to erase an entirety of the memory 214 may be performed by setting a single value, and thus a duration of performance of the command may be less than a threshold, such as 1 ms. As illustrated in FIG. 2, entries in the first layer 204 and the second layer (e.g., the portions 206-212) of the address translation table may remain after performance of the erase command.

Referring to FIG. 2C, a third portion of the method of setting a value of an indicator of an active address translation table to a particular value is shown and designated 240. The third method portion illustrated in FIG. 2C may be subsequent to the second method portion of FIG. 2B. In FIG. 2C, each entry in the first layer 204 and the second layer of the address translation table is set to a NULL value. In other implementations, the entries may be set to a different value that indicates an erase state or an initialized state. As described with reference to FIG. 1, setting the entries to the NULL value (or other erase state value) may be performed during background operations. Additionally, the blocks of the memory 214 may be set to an erase state during background erase operations. The background operations may be performed during periods of inactivity, when more processing resources are available. Thus, setting the entries to NULL in this manner may be more efficient, and may increase performance, of the memory 214 as compared to other memory erase techniques.

By setting a value of a pointer to a particular value (e.g., a NULL value), the method of FIGS. 2A-2C may enable completion of a memory erase command with reduced latency as compared to modifying (e.g., erasing) each entry of an active address translation table. As a result, a delay associated with erasing the memory may be reduced as compared to a delay associated with setting the value of the pointer, improving an overall throughput of operations at a data storage device.

Figure 3A:
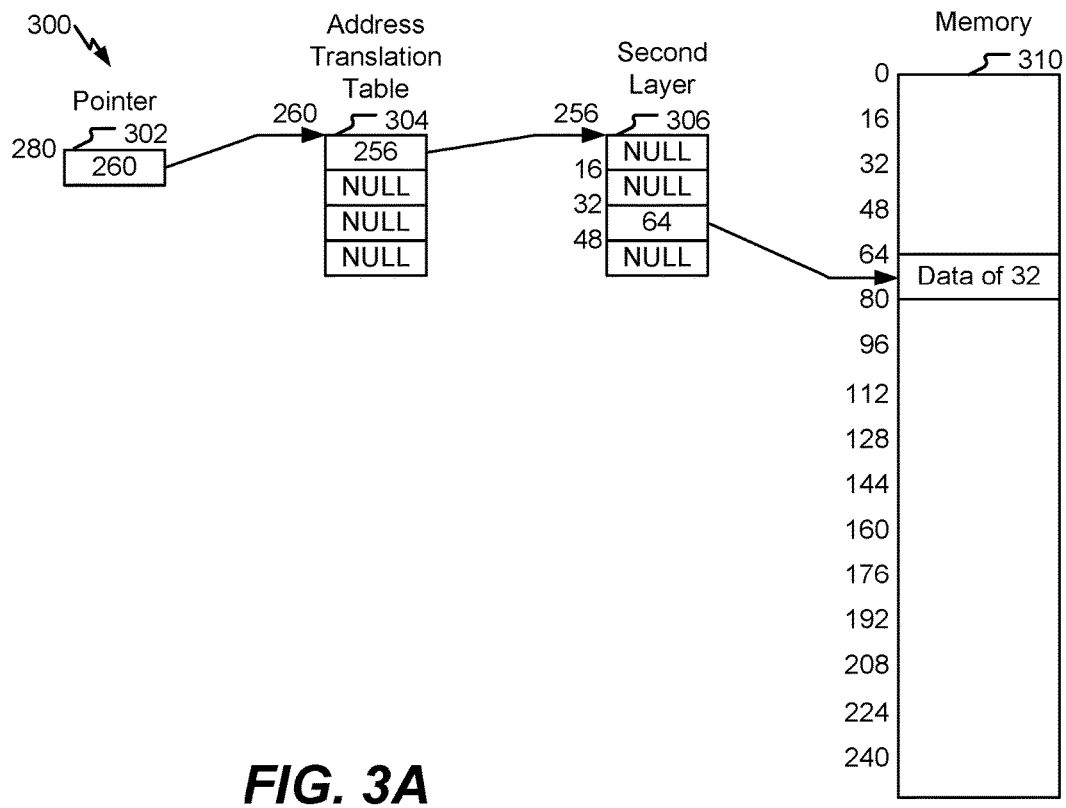
FIGS. 3A-3B illustrate an illustrative example of a method of updating an address translation table.
Figure 3B:
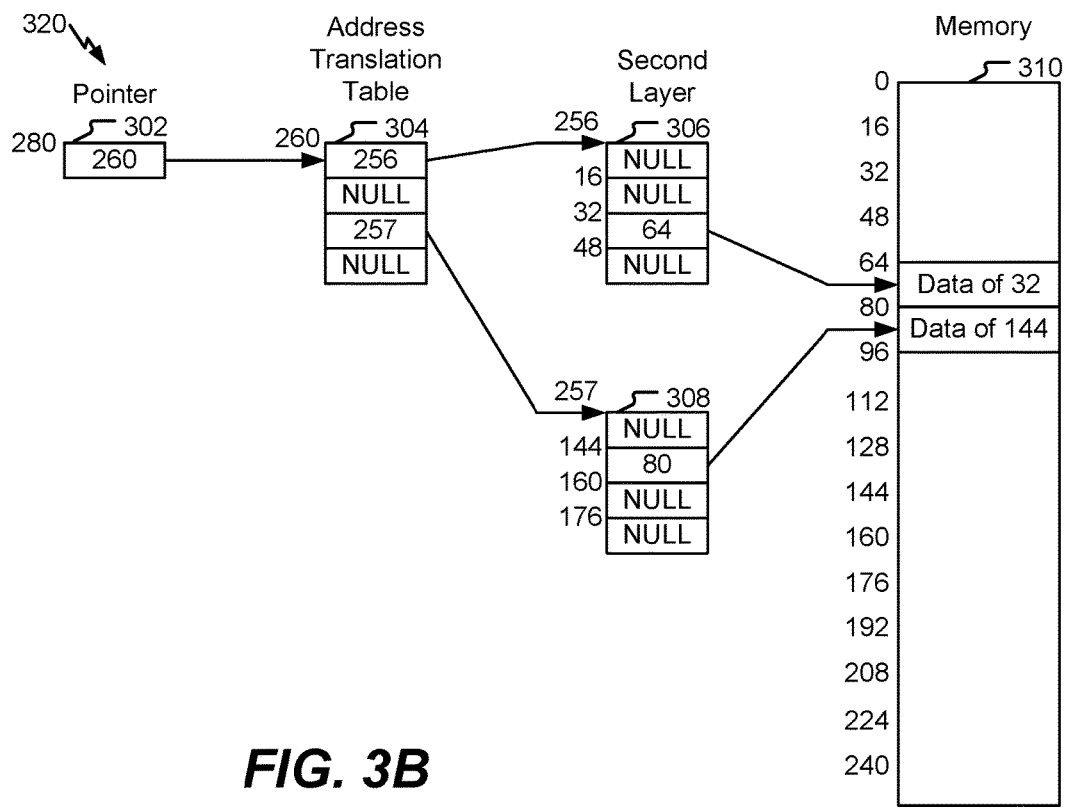

FIGS. 3A-3B illustrate an illustrative example of a method of updating an address translation table. Referring to FIG. 3A, a first portion of the method is shown and designated 300. In FIG. 3A, a pointer 302 points to an active address translation table. In a particular implementation, the pointer 302 may correspond to the pointer 168 of FIG. 1. The pointer 302 indicates an address of a first layer 304 of an address translation table. The pointer 302 may also be referred to as the "root" of the address translation table. The first layer 304 includes one or more entries. Each of the one or more entries indicates an address of a first portion 306 of a second layer of the address translation table. For example, the address may be an address in the controller memory 170 of FIG. 1. The first portion 306 of the second layer includes one or more entries that may indicate a logical-to-physical mapping associated with a corresponding physical address in a memory 310. In a particular implementation, the memory 310 may correspond to the memory 104 of FIG. 1.

FIG. 3A illustrates an implementation of an address translation table having four entries in the first portion 306 of the second layer, and entries having a non-NULL value may correspond to a 16 kilobyte (KB) block in the memory 310. In other implementations, the first portion 306 of the second layer of the address translation table may have fewer than four or more than four entries, and the corresponding blocks in the memory 310 may be larger than 16 KB or smaller than 16 KB. The first layer 304 of the address translation table include four entries, and a first non-NULL value indicates a location (e.g., an address) of the first portion 306 of the second layer. In other implementations, the layers may be divided differently and may have other numbers of entries. The implementation in FIG. 3A illustrates one entry (e.g., block of data) being stored in the memory 310, at memory location (e.g., physical address, in KB) 164. A logical-to-physical mapping is stored in an entry of the first portion 306 of the second layer of the address translation table at table location (e.g., table byte index) 32. The first entry corresponds to a first write operation at the memory 310.

Referring to FIG. 3B, a second portion of the method of updating an address translation table is shown and designated 320. The second method portion illustrated in FIG. 3B may be subsequent to the first method portion of FIG. 3A.

In FIG. 3B, a second entry has been added to the address translation table. For example, the second entry may be added in response to performance of a second write operation at the memory 310. To illustrate, the memory management system 162 may determine a second logical-to-physical mapping based on a second logical address associated with the second write operation. In the implementation of FIG. 3B, the second logical-to-physical address may be added to an entry of a second portion 308 of the second layer of the address translation table. For example, the logical-to-physical mapping may be added at table location 144 in the second portion 308 of the second layer of the address translation table, and the entry may correspond to an entry in the memory 310 at memory location 80. An entry in the first layer 304 of the address translation table may indicate the second portion 308 of the second layer.

By setting a value of one or more entries in the address translation table as write operations are performed, the address translation table may be updated dynamically. Thus, entries in an address translation table may be initialized to a common value, which is faster than generating an address translation table with each entry storing a logical-to-physical translation.

Although the implementations of FIGS. 2A-2C and FIGS. 3A-3B describe hierarchical address translation tables, such implementations are not limiting. In other implementations, the address translation tables may have a single layer, and non-NULL entries in the single layer may indicate entries (e.g., a write blocks) in the memory.

Figure 4A:
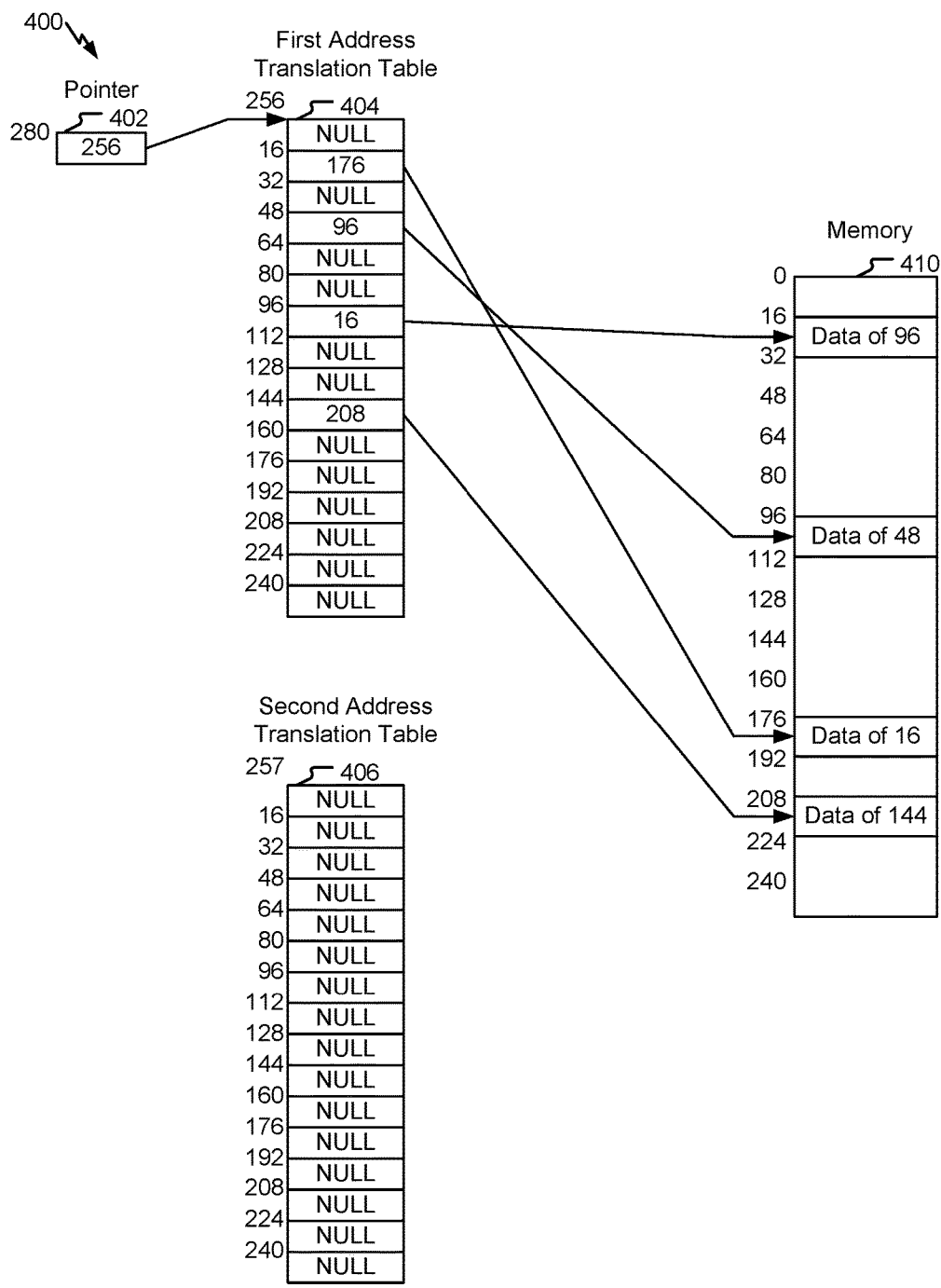
FIGS. 4A-4C illustrate an illustrative example of a method of switching an active address translation table from a first address translation table to a second address translation table.
Figure 4B:
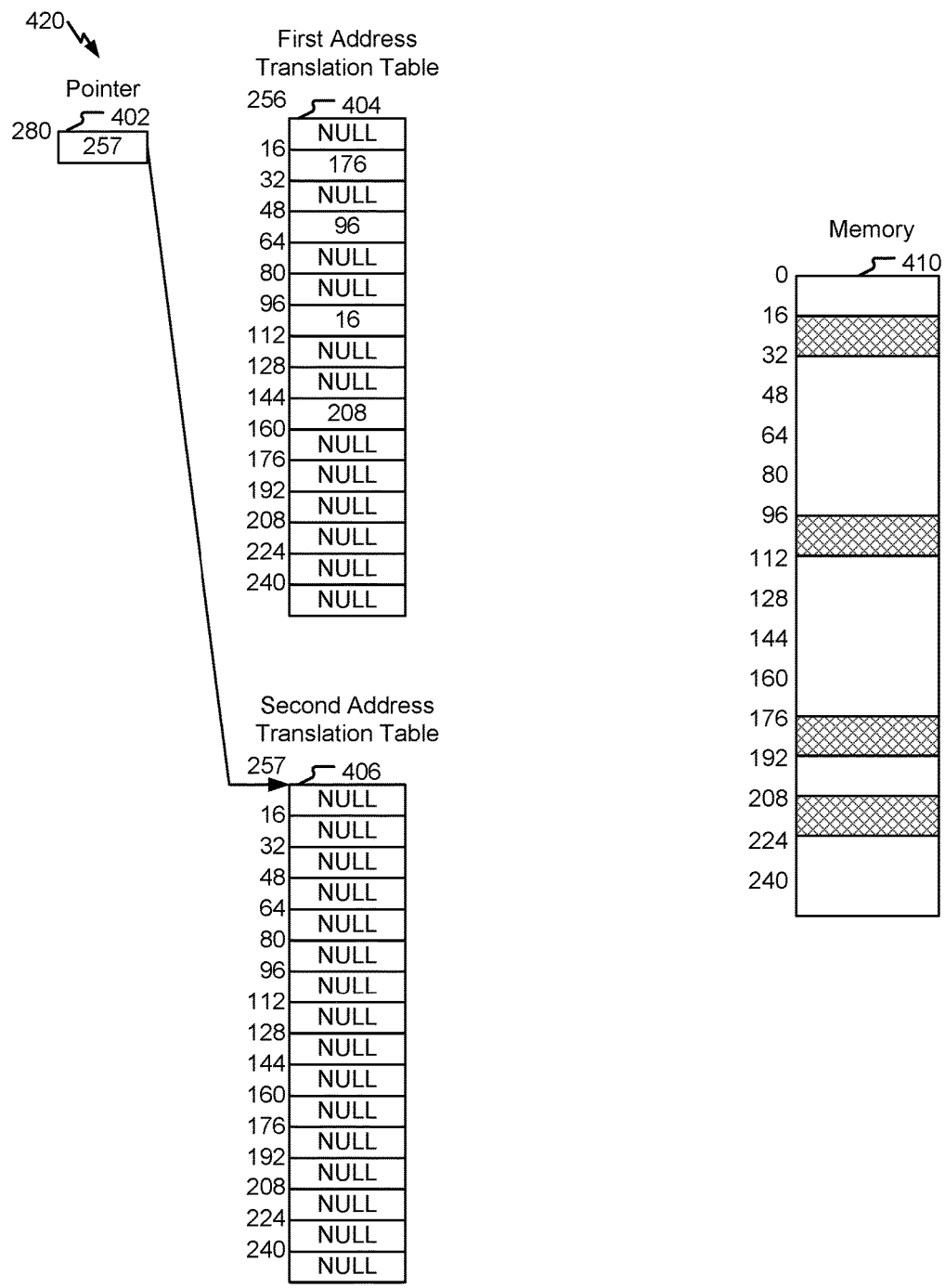
Figure 4C:
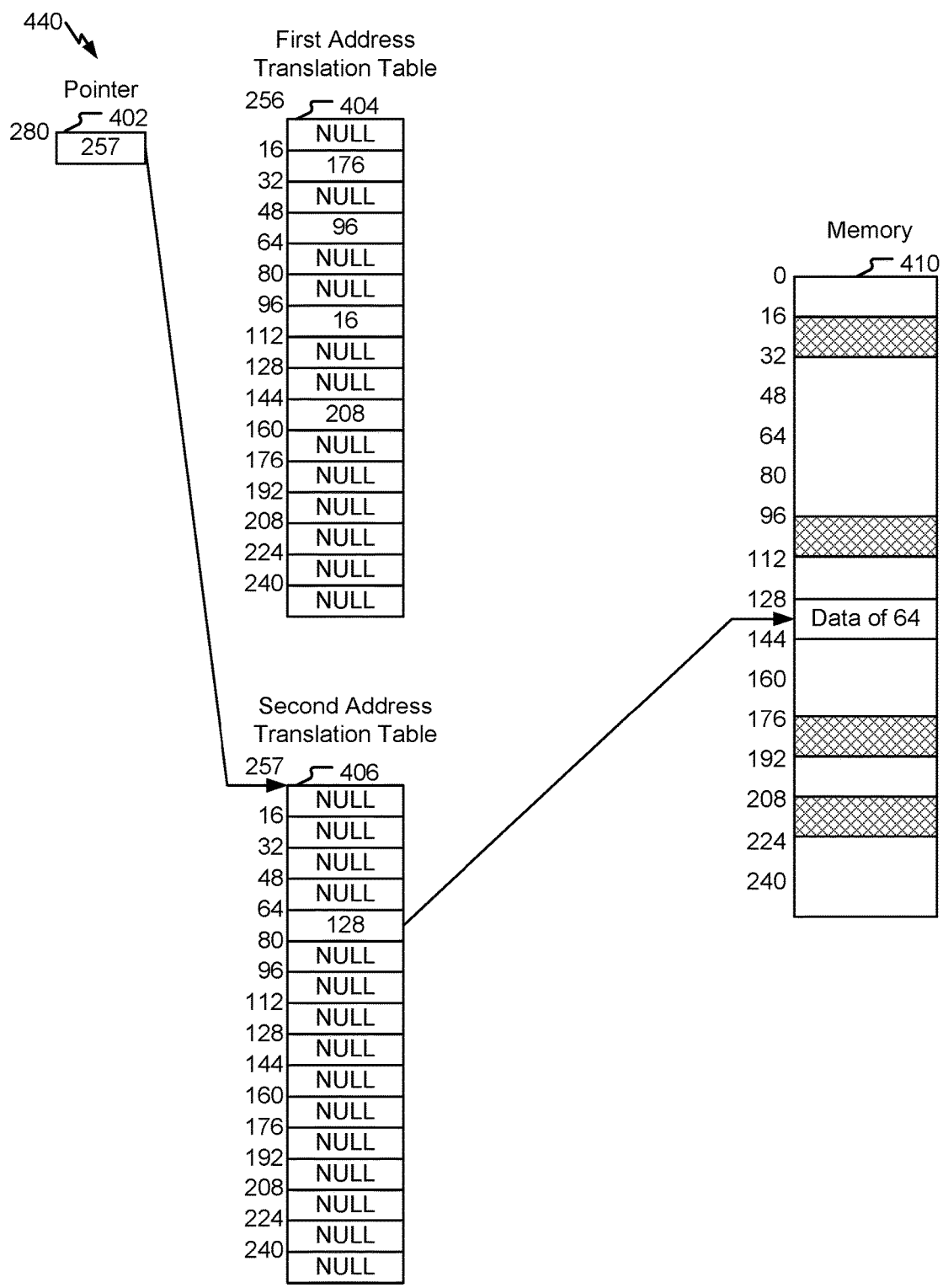

FIGS. 4A-4C illustrate an illustrative example of a method of switching an active address translation table from a first address translation table to a second address translation table. Referring to FIG. 4A, a first portion of the method is shown and designated 400. In FIG. 4A, a pointer 402 points to (e.g., indicates an address of) a first address translation table 404. In a particular implementation, the pointer 402 may correspond to the pointer 168 of FIG. 1. The first address translation table 404 may be designated as an active address translation table, and the pointer 402 may also be referred to as the "root" of the active address translation table. The first address translation table 404 includes one or more entries. The one or more entries may indicate a logical-to-physical mapping associated with a corresponding physical address in a memory 410. In a particular implementation, the memory 410 may correspond to the memory 104 of FIG. 1.

FIG. 4A illustrates an implementation of the first address translation table 404 having 16 entries, and entries having a non-NULL value may correspond to a 16 kilobyte (KB) block in the memory 410. In other implementations, the first address translation table 404 may have fewer than 16 or more than 16 entries, and the corresponding blocks in the memory 410 may be larger than 16 KB or smaller than 16 KB. The implementation in FIG. 4A illustrates four entries (e.g., blocks of data) being stored in the memory 410, at memory locations (e.g., physical addresses, in KB) 16, 96, 176, and 208. Logical-to-physical mappings are stored in entries of the first address translation table 404 at table locations (e.g., table byte indices) 16, 48, 96, and 144, respectively. FIG. 4A also illustrates a second address translation table 406. Each entry in the second address translation table 406 is set to an initial value (e.g., a NULL value, such as an all-zero value, that indicates an erase state).

Referring to FIG. 4B, a second portion of the method of switching an active address translation table from a first address translation table to a second address translation table is shown and designated 420. The second method portion illustrated in FIG. 4B may be subsequent to the first method portion of FIG. 4A.

In FIG. 4B, a value of the pointer 402 is modified. After modification, the value of the pointer 402 indicates an address of the second address translation table 406. The value of the pointer 402 may be modified in response to receiving an erase command. For example, the value of the pointer 402 may be modified to indicate the address of the second address translation table 406 in response to receiving the erase command 152 of FIG. 1. To further illustrate, a value stored in the register (e.g., the register 166 of FIG. 1) that indicates the address of the first address translation table 404 may be overwritten with a value that indicates the address of the second address translation table 406. The erase command may be complete after modifying the pointer 402 (and transmitting an acknowledgement). After modifying the pointer 402, the data stored in the memory 410 and associated entries in the first address translation table 404 becomes obsolete. Additionally, as illustrated in FIG. 4B, entries of the first address translation table 404 may not be erased (e.g., set to an erase state, such as a NULL value) upon completion of the erase command.

Referring to FIG. 4C, a third portion of the method of switching an active address translation table from a first address translation table to a second address translation table is shown and designated 440. The third method portion illustrated in FIG. 4C may be subsequent to the second method portion of FIG. 4B.

In FIG. 4C, a first entry is added to the second address translation table 406. The first entry may be added in response to a controller issuing a write command to the memory 410. A memory management system (e.g., the memory management system 162 of FIG. 1) may determine a first logical-to-physical mapping to be stored in the entry in the second address translation table 406, and the logical-to-physical translation may be used to write data to the memory 410. For example, data may be written to a block at memory location 128 of the memory, and the corresponding logical-to-physical translation may be stored at table location 64 in the second address translation table 406. As addition write operations are issued to the memory 410, additional entries may be stored in the second address translation table 406. Additionally, as described with reference to FIG. 1, entries in the first address translation table 404, the memory 410, or both may be erased (e.g., set to an erase state) during background operations.

By switching a value of a pointer from indicating a first address translation table to indicating a second address translation table, the method of FIGS. 4A-4C may enable completion of a memory erase command with reduced latency as compared to modifying (e.g., erasing) each entry of an active address translation table. As a result, a delay associated with erasing the memory may be reduced as compared to a delay associated with setting the value of the pointer, improving an overall throughput of operations at a data storage device.

Although the implementation of FIGS. 4A-4C describes a single-level (e.g., a non-hierarchical) address translation table, such implementation is not limiting. In other implementations, the address translation table may be hierarchical (e.g., may include multiple layers), non-NULL entries in some layers may indicate addresses of other layers, and non-NULL entries in a particular (e.g., a "lowest") layer may indicate entries (e.g., a write blocks) in the memory. Additionally or alternatively, although FIGS. 2A-2C, 3A-3B, and 4A-4C describe the address translation tables and the pointer as being stored in a controller memory, in other implementations, the address translation tables, the pointer, or both may be stored in the memories 214, 310, and 410.

Figure 5:
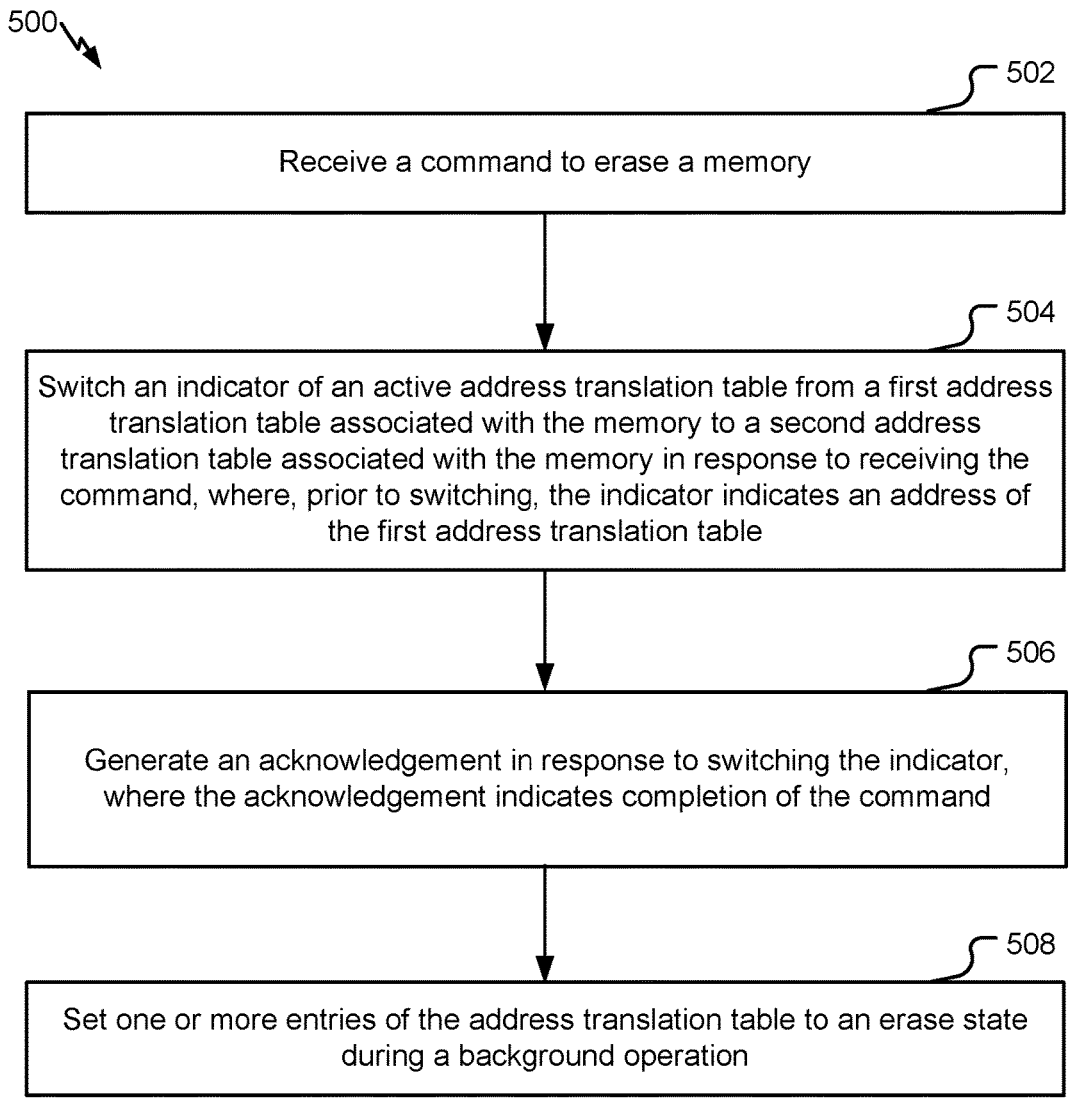
FIG. 5 is a flow diagram that illustrates an example of a method of switching an indicator of an active address translation table in response to receiving a command to erase a memory.

Referring to FIG. 5, a particular illustrative example of a method 500 of switching an indicator of an active address translation table in response to receiving a command to erase a memory is shown. The method 500 may be performed at a controller of a device, such as the data storage device 102 of FIG. 1.

A command to erase a memory is received, at 502. For example, the command may indicate an amount of the memory to be erased, and the amount may correspond to an entirety of the memory. The command may be received from a host device, such as the erase command 152 received from the access device 150 of FIG. 1.

An indicator of an active address translation table is switched from a first address translation table associated with the memory to a second address translation table associated with the memory in response to receiving the command, at 504. The indicator may correspond to the pointer 168 of FIG. 1 or the handler 180 of FIG. 1. Prior to switching, the indicator indicates an address of the first address translation table, such as the first address translation table 172 of FIG. 1. To illustrate, the first address translation table may include a first grouping of entries and at least one entry of the first grouping of entries may indicate a second grouping of entries. The second grouping of entries may indicate one or more physical addresses of the memory. After switching, the indicator may indicate an address of the second address translation table 174 of FIG. 1. The second address translation table may have been generated during operation of the memory prior to switching the indicator.

Switching the indicator may include modifying a value of a pointer for the active address translation table by setting the value to a value that indicates a location of the second address translation table. As another example, switching the indicator may include modifying a handler associated with the memory.

An acknowledgement may be generated in response to switching the indicator, at 506. In an illustrative implementation, the acknowledgement indicates completion of the command. The acknowledgement may be transmitted to a host device, such as the acknowledgement 158 sent to the access device 150 of FIG. 1. A duration of a time period from receiving the command to transmitting the acknowledgement may be less than a threshold.

After switching the indicator, one or more entries of the first address translation table may be set to an erase state during a background operation, at 508. For example, the background operation may correspond to the background erase operation 140 of FIG. 1.

The method 500 may include, after switching the indicator to the second address translation table, receiving a second command to erase the memory. A value of a pointer for the active address translation table may be modified by setting the value to a NULL value.

By switching the indicator, the method 500 may enable completion of a memory erase command with reduced latency as compared to modifying (e.g., erasing) entries of the active address translation table. As a result, a delay associated with erasing the memory may be reduced to a delay associated with switching the indicator, improving an overall throughput of operations at the device. Although particular elements of the method 500 have been described above, in other implementations, the method 500 may omit one or more of the above-described elements, or one or more elements may be performed in a different order. Additionally or alternatively, one or more of the elements of the method 500 may be combined.

Figure 6:
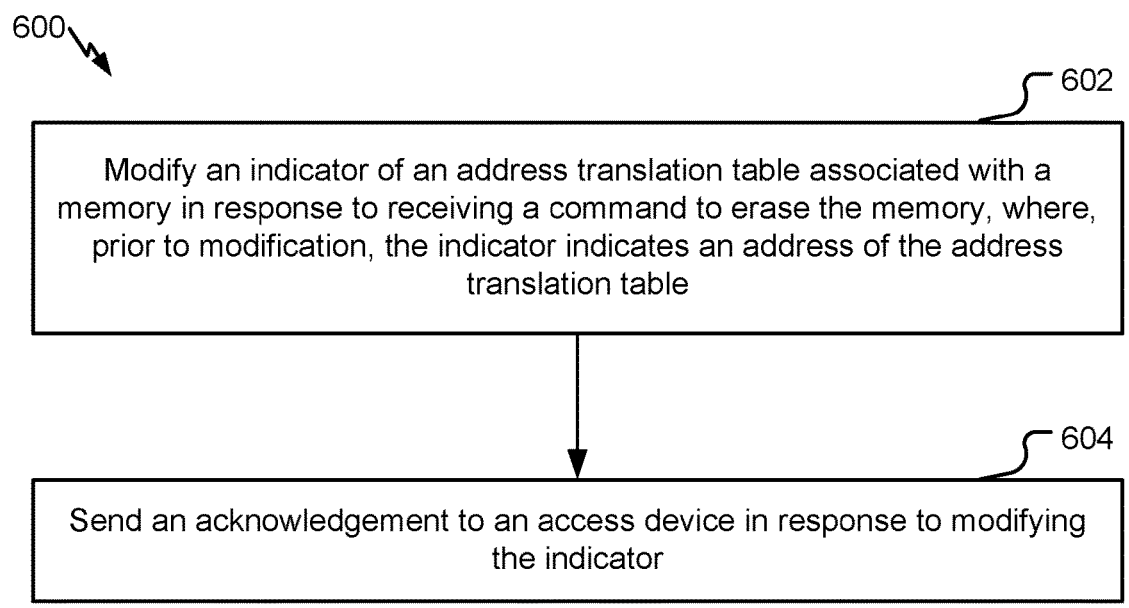
FIG. 6 is a flow diagram that illustrates an example of a method of modifying an indicator of an address translation table.

Referring to FIG. 6, a particular illustrative example of a method 600 of modifying an indicator of an address translation table is shown. The method 600 may be performed at a controller of a device, such as the data storage device 102 of FIG. 1.

An indicator of an address translation table associated with a memory is modified in response to receiving a command to erase the memory, at 602. For example, the command may correspond to the erase command 152 of FIG. 1 and may include an initial address value of the memory and a size of an entirety of the memory. In some implementations, the command may be an atomic instruction. Prior to modification, the indicator indicates an address of the address translation table. For example, the indicator may include the pointer 168 of FIG. 1 or the handler 180 of FIG. 1. Modifying the indicator may include setting a value of a pointer for the address translation table to a NULL value or setting the value to a second value that indicates an address of a second address translation table associated with the memory, such as the second address translation table 174 of FIG. 1.

An acknowledgement is sent to an access device in response to modifying the indicator, at 604. In a particular aspect, a duration of time from receiving the command to sending the acknowledgement is less than a threshold. The acknowledgement may correspond to the acknowledgement 158 of FIG. 1.

The method 600 may also include setting one or more entries of the address translation table to an erase state during a background operation. The background operation occurs subsequent to sending the acknowledgement. For example, the background operation may correspond to the background erase operation 140 of FIG. 1.

By switching the indicator, the method 600 may enable sending the acknowledgement with reduced latency as compared to first modifying (e.g., erasing) entries of the active address translation table. As a result, a delay associated with erasing the memory may be reduced to a delay associated with switching the indicator, improving an overall throughput of operations at the device. Although particular elements of the method 600 have been described above, in other implementations, the method 600 may omit one or more of the above-described elements, or one or more elements may be performed in a different order. Additionally or alternatively, one or more of the elements of the method 600 may be combined.

The method 500 of FIG. 5, the method 600 of FIG. 6, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 500 of FIG. 5, the method 600 of FIG. 6, or a combination thereof, can be initiated or controlled by one or more processors, such as one or more processors included in or coupled to a controller or a memory of the data storage device 102 and/or the access device 150 of FIG. 1. As an example, the method 500 of FIG. 5, the method 600 of FIG. 6, or a combination thereof, individually or in combination, may be performed by the controller 120 of FIG. 1. To illustrate, a portion of the method 500 of FIG. 5 or a portion of the method 600 of FIG. 6 may be combined with other operations described herein. Additionally, one or more operations described with reference to FIGS. 5-6 may be optional, may be performed at least partially concurrently, and/or may be performed in a different order than shown or described.

In an illustrative example, a processor may be programmed to modify an indicator of an address translation table associated with a memory in response to receiving a command to erase the memory, where, prior to modification, the indicator indicates an address of the address translation table. For example, the processor may execute instructions to write a NULL value to a pointer (e.g., write an all-zeros value to the register 166 of FIG. 1) that points to the active address translation table or to retrieve an address of a second address translation table and to write the address of the second address translation table to the pointer (e.g., into the register 166 of FIG. 1). The processor may further execute instructions to send an acknowledge message in response to modifying the indicator.

Figure 7:
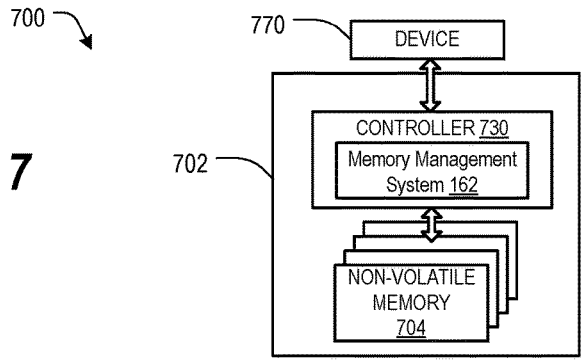
FIG. 7 is a block diagram of a particular illustrative implementation of a non-volatile memory system.

Referring to FIG. 7, a system 700 includes a non-volatile memory system 702 (e.g., the data storage device 102) that may be coupled to a device 770 (e.g., the access device 150). The non-volatile memory system 702 includes a controller 730 (e.g., the controller 120) and non-volatile memory that may be made up of one or more non-volatile memory dies 704 (e.g., one or more memory dies included in the memory 104). As used herein, the term "memory die" refers to the collection of non-volatile memory cells, and associated circuitry for managing the physical operation of those non-volatile memory cells, that are formed on a single semiconductor substrate. The controller 730 interfaces with the device 770 and transmits command sequences for read, program, and erase operations to the one or more non-volatile memory dies 704. The controller 730 includes the memory management system 162.

The controller 730 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 730 may be configured with hardware and/or firmware to perform the various functions described above and shown in the flow diagrams. Also, some of the components shown as being internal to the controller 730 can be stored external to the controller 730, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 704 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 730 and the one or more non-volatile memory dies 704 may be any suitable flash interface, such as Toggle Mode 200, 400, or 800. In one implementation, the non-volatile memory system 702 may be a card based system, such as a secure digital (SD) or a micro secure digital (micro-SD) card. In an alternate implementation, the non-volatile memory system 702 may be part of an embedded memory system.

Although, in the example illustrated in FIG. 7, the non-volatile memory system 702 (sometimes referred to herein as a storage module) includes a single channel between the controller 730 and the one or more non-volatile memory dies 704, the subject matter described herein is not limited to having a single memory channel. For example, in some NAND memory system architectures, 2, 4, 8 or more NAND channels may exist between the controller 730 and the NAND memory device, depending on controller capabilities. In any of the embodiments described herein, more than a single channel may exist between the controller 730 and the one or more non-volatile memory dies 704, even if a single channel is shown in the drawings.

Figure 8:
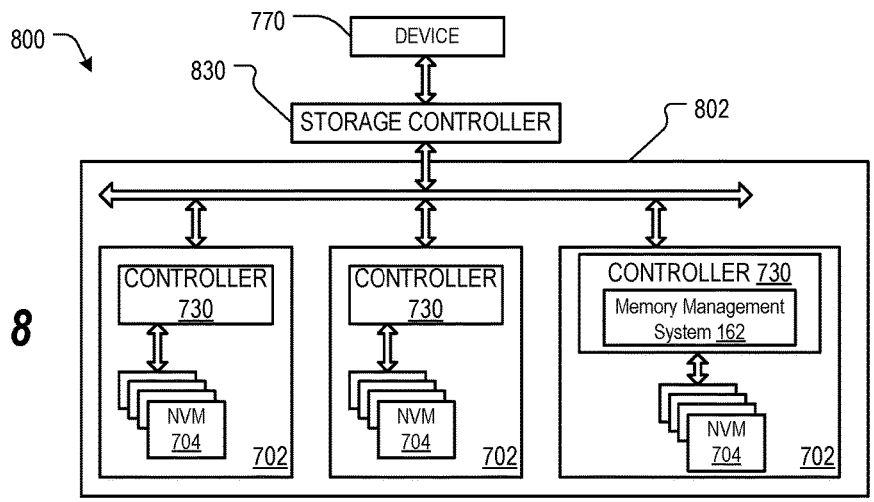
FIG. 8 is a block diagram of a particular illustrative implementation of a storage module including a plurality of the non-volatile memory systems of FIG. 7.

FIG. 8 illustrates a storage system 800 that includes multiple non-volatile memory systems 702. As such, storage system 800 may include a storage controller 830 that interfaces with the device 770 (e.g., a host device) and with a storage system 802, which includes a plurality of non-volatile memory systems 702. The interface between the storage controller 830 and the non-volatile memory systems 702 may be a bus interface, such as a serial advanced technology attachment (SATA) or peripheral component interface express (PCIe) interface. The storage system 800 may correspond to a solid state drive (SSD), such as found in portable computing devices, such as laptop computers, and tablet computers. One or more of the controllers 730 of FIG. 8 may include the memory management system 162. The storage controller 830 may include the memory management system 162.

Figure 9:
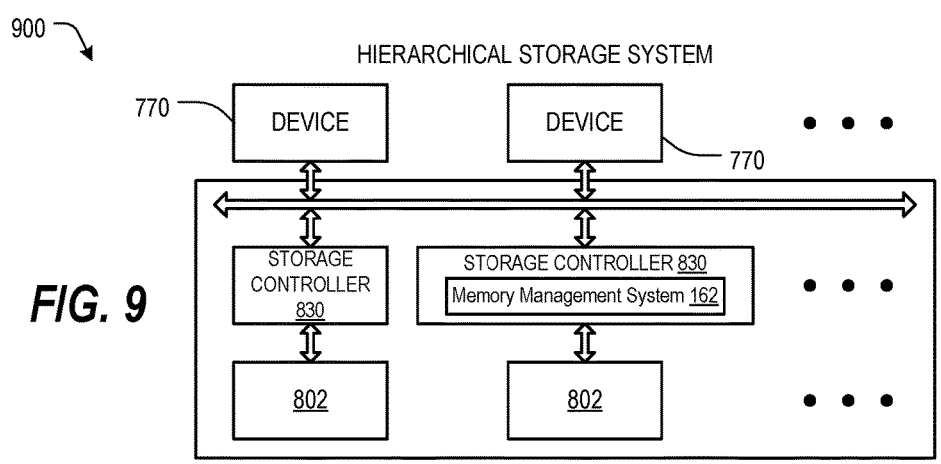
FIG. 9 is a block diagram of a particular illustrative implementation of a hierarchical storage system.

FIG. 9 is a block diagram illustrating a hierarchical storage system 900. The hierarchical storage system 900 includes a plurality of storage controllers 830, each of which controls a respective storage system 802. Devices 770 (e.g., one or more host devices or accessing devices) may access memories within the hierarchical storage system 900 via a bus interface. In one implementation, the bus interface may be an NVMe or fiber channel over Ethernet (FCoE) interface. In one implementation, the hierarchical storage system 900 illustrated in FIG. 9 may be a rack mountable mass storage system that is accessible by multiple host computers, such as would be found in a data center or other location where mass storage is needed. One or more storage controllers 830 of FIG. 9 may include the memory management system 162.

Figure 10:
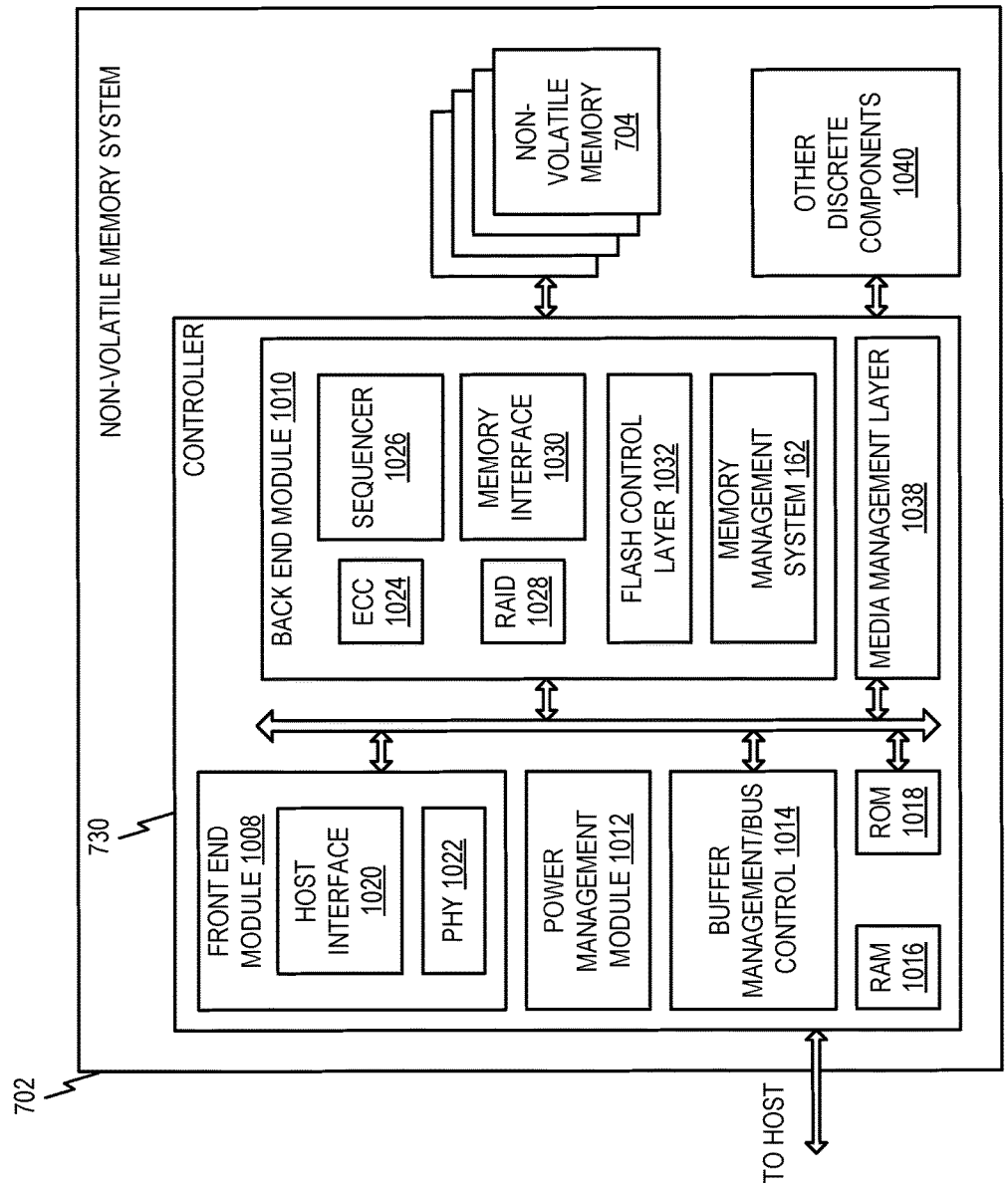
FIG. 10 is a block diagram of components of a particular illustrative implementation of a controller.

FIG. 10 is a block diagram illustrating exemplary components of the controller 730 of the non-volatile memory system 702 in more detail. The controller 730 may include the memory management system 162. The controller 730 also includes a front end component 1008 that interfaces with a host device, a back end component 1010 that interfaces with the one or more non-volatile memory dies 704, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 730, a buffer manager/bus controller 1014 manages buffers in random access memory (RAM) 1016 and controls the internal bus arbitration of the controller 730. A read only memory (ROM) 1018 stores system boot code. Although illustrated in FIG. 10 as located within the controller 730, in other embodiments one or both of the RAM 1016 and the ROM 1018 may be located externally to the controller 730. In yet other embodiments, portions of RAM and ROM may be located both within the controller 730 and outside the controller 730.

Front end component 1008 includes a host interface 1020 and a physical layer interface (PHY) 1022 that provide the electrical interface with the host device or next level storage controller. The choice of the type of host interface 1020 can depend on the type of memory being used. Examples of host interfaces 1020 include, but are not limited to, SATA, SATA Express, SAS, Fibre Channel, USB, PCIe, and NVMe. The host interface 1020 typically facilitates transfer for data, control signals, and timing signals.

Back end component 1010 includes an error correcting code (ECC) engine 1024 that encodes the data received from the host device, and decodes and error corrects the data read from the non-volatile memory. A command sequencer 1026 generates command sequences, such as program and erase command sequences, to be transmitted to the one or more non-volatile memory dies 704. A RAID (Redundant Array of Independent Drives) component 1028 manages generation of RAID parity and recovery of failed data. The RAID parity may be used as an additional level of integrity protection for the data being written into the one or more non-volatile memory dies 704. In some cases, the RAID component 1028 may be a part of the ECC engine 1024. A memory interface 1030 provides the command sequences to the non-volatile memory dies 704 and receives status information from the one or more non-volatile memory dies 704. For example, the memory interface 1030 may be a double data rate (DDR) interface, such as a Toggle Mode 200, 800, or 800 interface. A flash control layer 1032 controls the overall operation of back end component 1010.

Additional components of the non-volatile memory system 702 illustrated in FIG. 10 include a power management component 1012 and a media management layer 1038, which performs wear leveling of memory cells of the one or more non-volatile memory dies 704. The non-volatile memory system 702 may also include one or more other components or features illustrated with reference to FIG. 1, such as the memory management system 162, as an illustrative example. Non-volatile memory system 702 also includes other discrete components 1040, such as external electrical interfaces, external RAM, resistors, capacitors, or other components that may interface with the controller 730. In alternative embodiments, one or more of the physical layer interface 1022, RAID component 1028, media management layer 1038 and buffer management/bus controller 1014 are optional components that are omitted from the controller 730.

Figure 11:
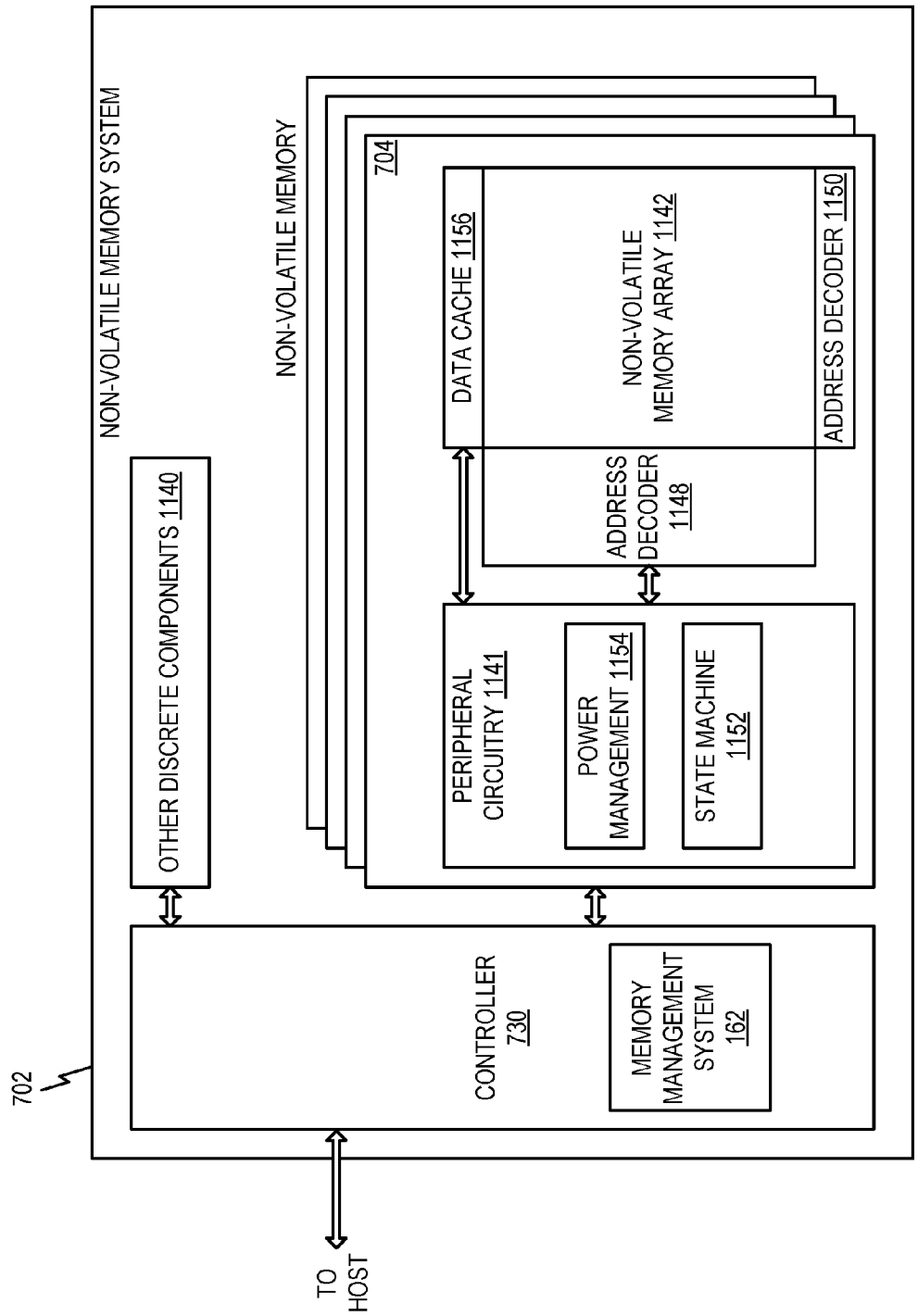
FIG. 11 is a block diagram of components of a particular illustrative implementation of a non-volatile memory die.

FIG. 11 is a block diagram illustrating exemplary components of the one or more non-volatile memory dies 704 of the non-volatile memory system 702 in more detail. The one or more non-volatile memory dies 704 include peripheral circuitry 1141 and a non-volatile memory array 1142. The non-volatile memory array 1142 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 1141 includes a state machine 1152 that provides status information to the controller 730. The peripheral circuitry 1141 may also include a power management or data latch control component 1154. The one or more non-volatile memory dies 704 further include discrete components 1140, an address decoder 1148, an address decoder 1150, and a data cache 1156 that caches data. FIG. 11 also illustrates that the controller 730 may include the memory management system 162.

Although various components of the data storage device 102 and/or the access device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 500 of FIG. 5 or the method 600 of FIG. 6. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

In some implementations, the data storage device 102 and the access device 150 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. The one or more protocols may include a standardized protocol and/or a non-standardized protocol, such as a proprietary protocol. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device with reduced latency to complete an erase command, comprising:
   a memory; and
   a controller coupled to the memory, wherein the controller is configured to:
      store an indicator of an active address translation table within the controller of the data storage device,
      maintain a first address translation table associated with the memory and a second address translation table associated with the memory,
      receive a command to erase the memory, and
      switch the indicator from the first address translation table to the second address translation table in response to receiving the command.

2. The data storage device of claim 1, wherein the controller is further configured to modify a value of a pointer for the active address translation table to switch the indicator from the first address translation table to the second address translation table.

3. The data storage device of claim 2, wherein, prior to modification, the value of the pointer indicates an address of the first address translation table.

4. The data storage device of claim 1, wherein the controller is further configured to modify a handler associated with the memory to switch the indicator from the first address translation table to the second address translation table.

5. The data storage device of claim 1, wherein the controller includes a memory management system that is configured to switch the indicator in response to receiving the command.

6. The data storage device of claim 1, wherein the controller is configured to maintain a third address translation table associated with the memory, wherein the controller is further configured to receive a second command to erase the memory, and wherein the controller is configured to modify a value of a pointer for the third address translation table by overwriting the value with a NULL value in response to receiving the second command.

7. The data storage device of claim 1, wherein the controller is further configured to modify the indicator such that the indicator identifies a location of the second address translation table to switch the indicator from the first address translation table to the second address translation table.

8. The data storage device of claim 1, wherein the indicator comprises a pointer for the active address translation table, and wherein the controller comprises a controller memory that includes the pointer.

9. The data storage device of claim 1, wherein the indicator comprises a pointer for the active address translation table, and wherein the controller comprises a register that includes the pointer.

10. The data storage device of claim 1, wherein the command to erase the memory comprises an instruction to erase an entirety of the memory.

11. The data storage device of claim 1, wherein the memory comprises a non-volatile memory.

12. A method performed by a controller of a data storage device to complete an erase command with reduced latency, the method comprising:
   storing an indicator of an active address translation table within the controller of the data storage device,
   receiving a command to erase a memory; and switching the indicator from a first address translation table associated with the memory to a second address translation table associated with the memory in response to receiving the command, wherein, prior to switching, the indicator indicates an address of the first address translation table.

13. The method of claim 12, further comprising:
receiving a second command to erase the memory; and
modifying a value of a pointer for the active address translation table by setting the value to a NULL value.

14. The method of claim 12, wherein switching the indicator comprises modifying a value of a pointer for the active address translation table by setting the value to a value that indicates a location of the second address translation table.

15. The method of claim 12, wherein switching the indicator comprises modifying a handler associated with the memory.

16. The method of claim 12, further comprising, prior to switching the indicator, generating the second address translation table during operation of the memory.

17. The method of claim 12, further comprising generating an acknowledgement in response to switching the indicator, wherein the acknowledgement indicates completion of the command.

18. The method of claim 17, further comprising transmitting the acknowledgement to a host device, wherein a duration of a time period from receiving the command to transmitting the acknowledgement is less than a threshold.

19. The method of claim 12, wherein the command indicates an amount of the memory to be erased, and wherein the amount corresponds to an entirety of the memory.

20. The method of claim 12, further comprising, after switching the indicator, setting one or more entries of the first address translation table to an erase state during a background operation.

21. The method of claim 12, wherein the first address translation table includes a first grouping of entries, wherein at least one entry of the first grouping of entries indicates a second grouping of entries, and wherein the second grouping of entries indicates one or more physical addresses of the memory.

22. The method of claim 12, wherein the command is received from a host device.

23. A data storage device with reduced latency to complete an erase command, comprising:
a memory; and
a controller coupled to the memory, wherein the controller is configured to:
store an indicator of a first address translation table within the controller of the data storage device,
maintain the first address translation table associated with the memory,
switch the indicator from the first address translation table to a second address translation table in response to receiving the command, and
send an acknowledgement to an access device in response to modifying the indicator.

24. The data storage device of claim 23, wherein the controller comprises a controller memory that includes the first address translation table and the second address translation table associated with the memory, and wherein the controller is further configured to modify the indicator by setting a value of a pointer for the first address translation table to a NULL value or setting the value to a second value that indicates an address of the second address translation table.

25. The data storage device of claim 23, wherein the controller comprises a memory management system that is configured to modify the indicator in response to receiving the command.

26. The data storage device of claim 23, further comprising a bus coupled to the controller and to the access device.

27. The data storage device of claim 26, wherein the controller is further configured to receive the command from the access device via the bus.

28. A method performed by a controller of a data storage device to complete an erase command with reduced latency, the method comprising:
storing an indicator of a first address translation table within the controller of the data storage device,
switching the indicator from the first address translation table to a second address translation table in response to receiving the command; and
sending an acknowledgement to an access device in response to modifying the indicator.

29. The method of claim 28, wherein modifying the indicator comprises setting a value of a pointer for the first address translation table to a NULL value or setting the value to a second value that indicates an address of the second address translation table associated with the memory.

30. The method of claim 28, wherein the command includes an initial address value of the memory and a size of an entirety of the memory.

31. The method of claim 28, wherein the command comprises an atomic instruction.

32. The method of claim 28, wherein a duration of time from receiving the command to sending the acknowledgement is less than a threshold.

33. The method of claim 28, further comprising setting one or more entries of the first address translation table to an erase state during a background operation, wherein the background operation occurs subsequent to sending the acknowledgement.

* * * * *